United States Patent [19]

Wang

[11] Patent Number: 4,814,996

[45] Date of Patent: Mar. 21, 1989

[54] PORTABLE ENERGY COST CALCULATION

[75] Inventor: Douglas W. Wang, University City, Mo.

[73] Assignee: Futures Technology, Ltd., St. Louis, Mo.

[21] Appl. No.: 387,177

[22] Filed: Jun. 10, 1982

[51] Int. Cl.⁴ .................... G01R 21/00; G06F 15/20
[52] U.S. Cl. .............................. 364/464.04; 324/142; 364/483
[58] Field of Search ............... 364/464, 483, 493, 550, 364/551, 464.04, 483; 324/113, 142

[56] References Cited

U.S. PATENT DOCUMENTS

| | | | |
|---|---|---|---|
| 3,780,273 | 12/1973 | Turrell | 235/150.52 |
| 3,953,795 | 4/1976 | Brunner et al. | 324/142 |
| 3,976,941 | 8/1976 | Milkovic | 324/142 |
| 4,079,313 | 3/1978 | Callon | 324/142 |
| 4,080,568 | 3/1978 | Funk | 364/464 X |
| 4,120,031 | 10/1978 | Kincheloe et al. | 364/464 |
| 4,147,978 | 4/1979 | Hicks | 324/142 |
| 4,207,557 | 6/1980 | Gilkeson et al. | 324/142 X |
| 4,233,590 | 11/1980 | Gilkeson et al. | 364/483 X |
| 4,291,376 | 9/1981 | McCahill | 364/492 X |
| 4,351,028 | 9/1982 | Peddie et al. | 364/464 X |
| 4,360,879 | 11/1982 | Cameron | 364/483 |
| 4,525,668 | 6/1985 | Lienhard et al. | 324/142 |

Primary Examiner—Parshotam S. Lall
Assistant Examiner—Edward R. Cosimano
Attorney, Agent, or Firm—Jerome A. Gross

[57] ABSTRACT

For measuring the current cost of an appliance, current cost-measuring apparatus includes a line voltage unit, which plugs into an electric outlet and into which the appliance is plugged, and a remote light-weight portable cost-measuring unit. It is adapted to measure varying current utilization in a lower range or in a range eight times as great. A current transducer within the line voltage unit delivers both signals of both levels to the remote unit, which includes a high speed voltage-to-pulse converter, which has a somewhat limited straight line range of operation, and a low speed calculator unit. Their inconsistency is resolved by feeding the pulse output to a multi-stage binary divider at whose eleventh and fourteenth output stages are output taps. Since the division at the fourteenth stage is eight times that at the eleventh stage, selecting the higher divisor output compensates for selecting the higher level of signal of current used. Such selection permits advantageous use of the straight line range of the voltage-to-frequency converter. The frequency divider issues output pulses for chain addition by a computer chip of a cost figure per kilowatt hour. Using the fourteenth divisor stage, one output pulse is issued for about sixteen thousand input pulses; the input pulses themselves are not accumulated. Hence the computer chip with an associated display of the type used in inexpensive pocket calculators is sufficient to reflect cost of current utilized over a substantial period of time.

7 Claims, 2 Drawing Sheets

PORTABLE ENERGY COST CALCULATION

TECHNICAL FIELD

The present apparatus measures the cost of current to an electric appliance.

Background Art

Off-the-shelf inexpensive electronic components which are commercially available include voltage-to-frequency converters having a desired straight line characteristic when operating in the range up to approximately 250 Hertz. Also readily available are calculator chips with associated display read-outs; but these are not suited for operation at such rapid speeds; and if pulsed at the most rapid speed possible, their capacity would be insufficient to reflect costs except for a very brief period.

In the more expensive microprocessor type energy cost calculators heretofore constructed, input pulses are developed at a slower rate and accumulated within a buffer memory or large binary counter network; and a display shows a read-out of the number of input pulses so stored over a period of time, which read-out may be multiplied by a cost rate per kilowatt.

Disclosure of the Invention

The purposes of the present invention are to furnish, inexpensively and with substantial accuracy, the energy cost of operating an electrical appliance whose current demand may vary; to make the same cost-measuring instrument serve whether the demand for current is high or low; to provide for entry into the calculator portion and to visually display the current rate or cost per kilowatt hour; to indicate in dollars the accumulated cost of operating an appliance from time of starting the instrument; and to provide as well a visual signal affording assurance to the user that the instrument has been started and is functioning properly.

These purposes are accomplished in the present apparatus by use of inexpensive electronic components. The apparatus consists of two units, a line voltage unit into which the appliance is plugged for receiving its current supply, which unit includes a current transducer to measure the current utilized by an appliance; and a portable compact cost-calculating unit supplied with low voltage d.c. current by the line voltage unit.

The current sensor portion of the line voltage unit transforms the current measurements into varying voltage signals at two levels, one at a higher multiple—preferably eight times—the voltage of the other. Both of these voltage signals are delivered to the remote cost calculator unit, at which a selector switch selects either the lower or the higher level voltage signal, whichever is best suited to fit within the straight line range of the voltage-to-frequency converter.

The selected voltage signal is amplified, put through a d.c. level shifter, converted to d.c. and fed into the simple voltage-to-frequency converter. To enable an inexpensive voltage-to-frequency converter, which forms pulses at a rapid rate, to operate a simple calculator chip, there is inserted between them an inexpensive 14-stage binary frequency divider, with an intermediate tap at its 11th stage. It will be recognized that this stage is activated eight times as frequently as the 14th output stage. The same selector switch used to select the transducer voltage output at the eight-times level compensatingly selects the 14th output tap of the frequency divider. Output pulse signals from the selected output tap direct the calculator chip to perform chain addition in increments of cost per 1/100th kilowatt hour.

The input pulses from the rapidly operating voltage-to-frequency converter to the frequency divider are never totaled; the divider capacity is sufficient merely to accumulate enough input pulses to issue a single output pulse at its final binary divisor stage. Thus if the 14th output stage is selected, the number of output pulses to the calculator chip is only one for each 16,384 pulses generated by the voltage-to-frequency converter. The components are so designed that 100 output pulses are generated for each kilowatt of energy utilized. Thus the chain addition performed by the chip is slow enough for its associated register to accumulate operating costs over a substantial number of days.

The small display, typically only eight places, may be divided into what would normally be the right hand three-digit portion, into which the rate per kilowatt hour may be entered, and the left hand five-digit portion, to the left thereof in a decimal sense. In this latter portion will appear the accumulated cost over a period of time. It will be seen that when 100 output pulses have been issued, using integer mathematics, the cost per kilowatt hour will have been transferred two decimal places from the right hand portion of the display into the left hand portion thereof.

Since the calculator chip is operated very slowly, the user is not likely to be looking at it when its total changes. In order to give the user visual assurance that the apparatus is operating, a blinking LED is triggered at the 5th output stage of the frequency divider, that is, 512 times for each output pulse at the 14th stage.

THE DRAWINGS

BEST MODE FOR CARRYING OUT THE INVENTION

Figure 1:
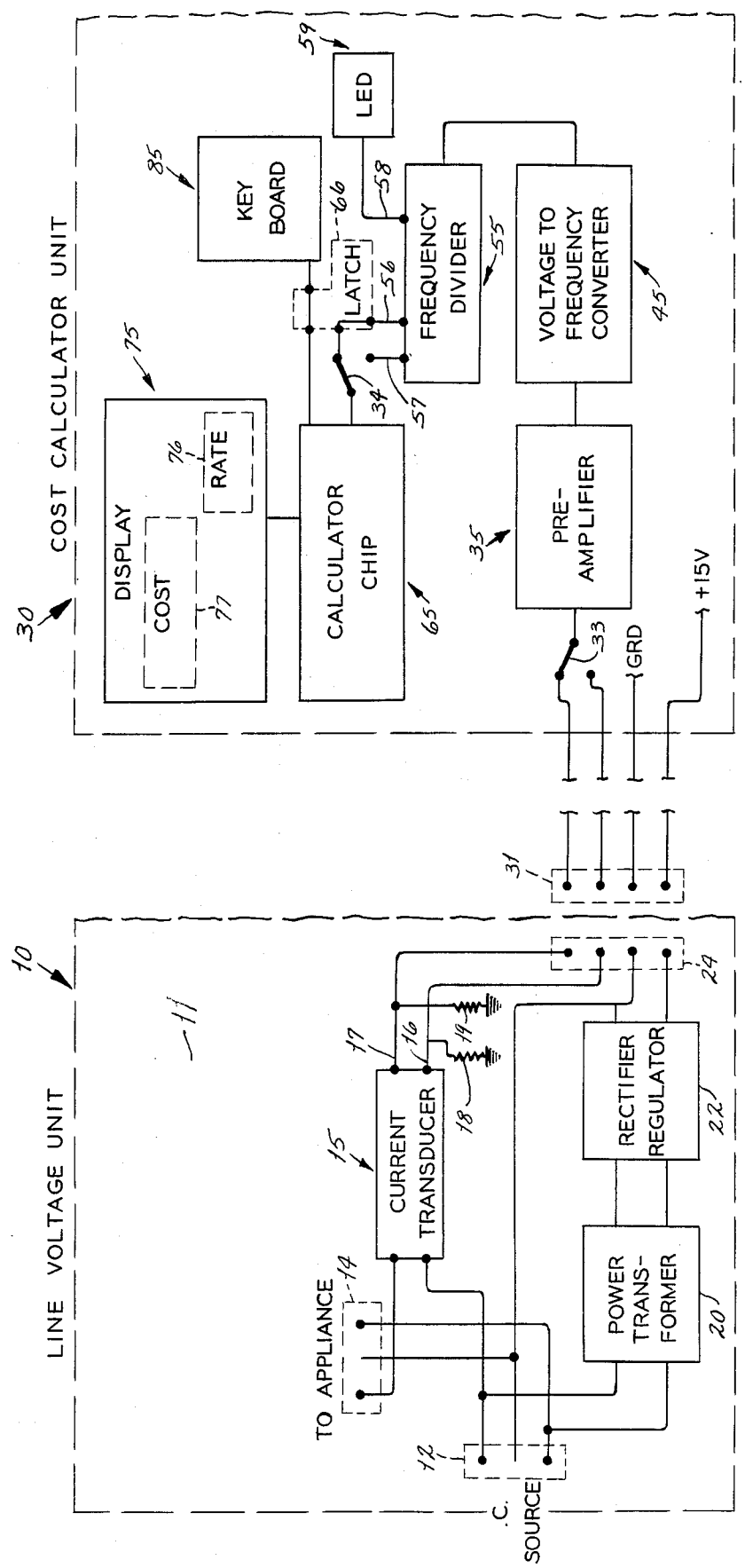
FIG. 1 is a schematic drawing showing the line voltage unit and the portable cost calculator unit of the present invention.

Referring now to FIG. 1, a line voltage unit generally designated 10 has a mounting block 11 having a conventional electric plug 12 for plugging into an a.c. current supply. On the mounting block 11 is a socket 14 into which is plugged the appliance whose current cost is to be measured. In one of the connectors between the plug 12 and the socket 14 is inserted a conventional transformer-type current transducer generally designated 15 which measures, with sufficient accuracy for practical purposes, the current utilized by the appliance plugged into socket 14.

The transducer 15 is tapped to provide a choice of levels of outlet voltage; a lower voltage level outlet tap 16 has its grounded resistance 18 and a higher voltage level outlet tap 17 has its grounded resistance 19. The higher level outlet tap 17 is at a chosen binary multiple of the voltage level at the lower level outlet tap 16, in this case at eight times the voltage level.

The line voltage unit 10 also includes a power transformer 20 and a conventional rectifier-regulator 22 by which 15 volt d.c. current and a ground is supplied to a four-connector socket 24, which also supplies connections to the two outlet taps 16, 17 of the current transducer 15.

A portable cost calculator unit generally designated 30 is connected to the connector socket 24 of the line voltage unit 10 by a flexible connector cable terminating in a four-pronged jack 31. Two of its terminals provide the 15 volt d.c. current and a ground connection for the several components of the cost calculator unit 30, whose principal components are generally designated as follows: a pre-amplifier 35, a voltage-to-frequency converter 45, a frequency divider 55, a calculator chip 65, a display 75, and a keyboard 85.

The connectors from the low and high voltage level taps 16, 17 of the current transducer 15 lead to a selector switch 33, so that the varying voltage from whichever of these taps 16, 17 is selected may be supplied to a pre-amplifier 35. Ganged with the switch 33 is a second switch 34 which selects between taps 56, 57 respectively at the 11th and 14th binary output stages of the frequency divider 55.

The pre-amplifier 35 includes means to amplify proportionately, effect a shifted d.c. level, and output an integrated varying voltage d.c. signal. This is fed to the voltage-to-frequency converter 45, an off-the-shelf item of the type characterized by a pulse frequency output which varies as a straight-line function of the excess of input voltage over an "offset" or minimum voltage required for operation. The d.c. level shift accomplished in the pre-amplifier 35 furnishes this offset. A typical low cost voltage-to-frequency converter of this type will have a linear range up to fully 250 Hertz in output.

The fourteen stage frequency divider 55 is adapted from a simple binary counter of the same capacity with the output taps 56, 57 at its 11th and 14th stages as heretofore described. An output tap 58 at its 5th stage actuates a conventional transistorized LED switch circuit generally designated 59 to furnish a blinking light even at very low current usage.

The pulses created by the voltage-to-frequency converter 45 input the frequency divider 55; each time the number of these inputs equals the binary divisor at the chosen 11th or 14th output stages 56, 57, its output pulse is issued in the conventional manner, as by a transistor switch, as a chain addition output pulse to the calculator chip 65. A principal function of the selector switch 33 is to utilize such a rate of amplification as will assure effective formation of input pulses within the straight line range of operation of the voltage-to-frequency converter 45, while the switch 34 selects a compensating rate of division by the frequency divider 55. This enables the apparatus to measure current utilization over both a lower utilization range, as for a household refrigerator, or at a much higher utilization range, as for a heater unit or a commercial frozen food box.

In engineering the components described, design values will be conventionally so determined upon the current transducer outputs 16, 17, the pre-amplifier 35, the voltage-to-frequency converter 45 and the binary output stage of the frequency divider 55, that 100 output pulses will be issued for each kilowatt hour of current utilized by the appliance. A frequency divider having more or fewer binary stages might be determined upon.

The display 75, of the type conventionally associated with the calculator chip 65, is divided into a three-digit portion which for mathematical purposes is referred to as the right hand portion 76 in which the cost per kilowatt hour may be entered in cents and tenths of cents, and a five-digit portion which for mathematical purposes is referred to as the left hand portion 77. The right hand display portion 76 has a permanent decimal point one place to the left; the left hand display portion 77 has a permanent decimal point two places to the left. A 12-key calculator keyboard generally designated 85 is used; the conventional calculator "clear" key is marked "rate"; the conventional "plus" key is marked "go"; the other function keys are omitted; and the "equals" connection is activated by the output tap of the frequency divider 55. Elimination of a decimal point key results in operation with only integer mathematics.

To start the instrument functioning at a time selected by the user, the "go" key is pressed. It will be seen that after starting, chain addition will cause the display digits to spread from the right hand display portion 76 into the left hand display portion 77; for example, on accrual of 100 output pulses the digits shown in the two decimal places at the left side of the right hand display portion 76 will now appear in the two places at the right side of the left hand display portion 77.

Alternatively, the design values could be chosen that some other whole number power of 10 output pulses might represent one kilowatt hour, for example, $10^3$, with compensating changes in using the display 75, as will be apparent. In any case, because of operation without a floating decimal point, the cost per kilowatt hour will increment the display a number of digit positions to the left of those in which the rate was entered, which number of positions equals the power of ten so selected.

A conventional latch 66 may be optionally interconnected between the frequency divider 55 and the calculator chip 65, which resets the frequency divider 55 to zero, also resetting the calculator chip 65 and the display 75 each time the "rate" key of the keyboard 85 is pressed.

Figure 2:
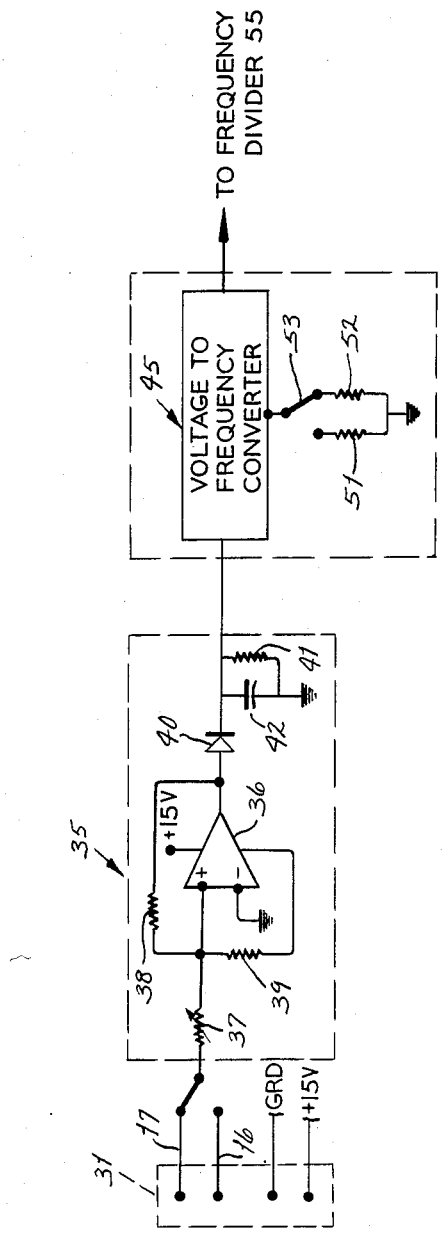
FIG. 2 is a somewhat more detailed diagram, partly schematic, showing some of the components of the cost calculator unit.

Referring now to the details shown in FIG. 2, the pre-amplifier 35 includes a conventional operational amplifier 36 to which the selected voltage signal from the lower or higher outlet line 16, 17 is fed through a variable resistor 37. The output level of the operational amplifier 36 is set at a design amplification factor by the relation of the variable resistor 37 to a fixed resistance 38, and a d.c. level shift is effected by the relation to the fixed resistor 38 to another fixed resistor 39. An integrator circuit consisting of a diode 40, a resistor 41 and a capacitor 42 serves to integrate the signal from the operational amplifier 36 into the varying d.c. voltage supplied to the voltage-to-frequency converter 45. Resistances 51, 52, selectively put in circuit by a line voltage selector switch 53, are designed to so adjust the voltage-to-frequency divider 45 as to utilize its full straight line range, for example, to 250 Hertz, whether the line voltage utilized by the appliance is 110V. or 220V.

Several advantages follow from having the line voltage unit 10 separate from the portable cost calculation unit 30. The more delicate electronic components of the cost calculation unit are not subject to the heat of the line voltage unit. The line voltage unit may be conveniently plugged into a base outlet and the appliance plugged into it, while the cost calculator unit cable is long enough to permit it to be hand held. If from time to time the operating cost of several appliances is to be determined, each may be supplied with, and may remain plugged into its own line voltage unit, while a single portable cost calculation unit may be successively connected to each of the several line voltage units for a sampling time period; thus one cost calculation unit may suffice for the several appliances.

The present invention includes the method of determining the energy costs of operating an electrical appliance, in which the current flow to such appliance is continuously measured over the time that its operating cost is to be determined and such continuous measurements are proportionately transformed into current flow of varying voltage at two levels, one being a binary multiple of the other, between which selection is made. The varying voltage at the selected level is transformed proportionately into pulses of varying frequency, which are fed as input pulses into a multi-stage frequency divider having two output stages, selection between which is made to compensate for the selection in selected voltage level at which the current flow is measured. The design values utilized in so measuring the current, transforming it to voltage and transforming it to pulses are such that a number of output pulses at the determined stage of the binary divider is a whole number power of ten for each kilowatt hour whose flow is measured. In ordinary calculator means there is inserted, as an adding constant, a number corresponding to the then cost of one kilowatt hour. On supplying the output pulses of the frequency divider as chain addition commands, the calculator additively sums the adding constant as integers, that is, without a floating decimal point, and the accumulated energy cost over the time the current flow is reflected in the calculator display. In this method the step of transforming measurements of current flow into a varying voltage includes so adjusting same, by amplification and the like, that the varying voltage may be linearly transformed into frequency.

Stated differently, the method of the invention includes using electronic components of the pocket calculator type, in which its associated display is divided into a mathematical right hand portion having a plurality of lower decimal positions and a left hand portion having a plurality of the next higher decimal positions, and entering the cost per kilowatt hour as an adding constant in cents in the two highest positions of the right hand portion. On then starting to measure the current flow to the appliance, continuous measurements of current flow are transformed into a varying voltage and then transformed proportionately into pulses of varying frequency; these are fed as input pulses into a multi-stage frequency divider which accumulates them until they reach a number corresponding to the binary divisor at a chosen output of the frequency divider, and on each such accumulation an output pulse is generated. These output pulses are supplied as chain addition commands to the calculator means. The stage of the frequency divider at which the output pulses are taken is so determined, and the design values utilized in so measuring the current, transforming to voltage, and transforming to frequency are so chosen, that 100 output pulses of the frequency divider reflect one kilowatt hour. Thus on chain addition without a floating decimal point, 100 pulses will so progressively increment the display as a whole as to move the cost per kilowatt, so entered in the right hand portion of the display, two decimal places into the lowest decimal portions of the left hand portion of the display.

In the claims, the term "adding integer constant" is used to mean calculating with only integer mathematics, that is, without floating a decimal point.

Various modifications will suggest themselves from this disclosure. For example, for some purposes it may be desirable to add a time clock in the cost calculator unit, or insert one between it and the line voltage unit. In any event, the use of the binary frequency divider to intermediate between the low cost inherently rapid voltage-to-frequency converter and the inherently slow-acting calculator chip—permits the present invention to fulfill the long-felt need for an inexpensive energy cost calculator.

Industrial Applicability

It is believed that apparatus embodying the present invention will be found to be most useful in residential and light commercial applications wherein the user seeks merely to sample energy costs from time to time, rather than to obtain constant precise totals of the energy cost of a single appliance. For sampling the energy costs of a number of appliances, the portability of the present apparatus, as well as its low cost, is most advantageous.

The embodiments of the invention in which an exclusive property or privilege is claimed are defined as follows:

1. Apparatus for determining the energy costs of operating an electrical appliance whose current demand may vary, comprising
   I. a line voltage unit including
      a. means to connect to line voltage the electrical appliance whose operating cost is to be determined, whereby to supply its demand for current, and
      b. means to continuously measure the varying flow of current so supplied to the appliance, in combination with
      c. means to transform and rectify line current, whereby direct current may be supplied at a lower voltage, and
   II. a cost calculating unit remote from the line voltage unit and so connected thereto as to receive a supply of such direct current therefrom, further having
      a. means to receive the varying measurements of current flow to such appliance and to transform into a correspondingly varying voltage,
      b. means to convert such voltage into pulses whose frequency varies substantially directly with the voltage,
      c. binary frequency divider means connected at its input to receive said pulses and having an output tap at a selected binary stage remote from its input, which output tap issues one output pulse each time a number of input pulses has been received corresponding to the divisor at said stage,
      d. calculator means so connected to said output tap as to receive said output pulses, the calculator means including means to insert an adding constant and a display having a plurality of digit positions, the display being incremented by the amount of said adding constant as an adding integer constant each time an output pulse is so issued, and
      e. means to so adjust the foregoing means Ib, II a and II b that a number of output pulses equal to a selected whole number power of ten will be so issued on the utilization by the appliance of one kilowatt hour, whereby on inserting as such adding constant the cost of one kilowatt hour, the display will show the accumulated cost of operation in digit positions to the left of those at which entered and determined by said selected whole number power of ten.

2. Apparatus as defined in claim 1, wherein the means to continuously measure the varying flow of current supplied to the appliance includes means to transmit same to said cost calculating unit at two levels, one being a binary multiple of the other, and within the cost calculating unit the frequency divider means has a second output tap at a binary stage whose divisor is related to that of the first output tap by the said binary multiple, and the cost calculating unit has switch means to select between said levels of transmission and compensatingly between said stages of the frequency divider, whereby selection may be made of whichever transmission level is advantageous for accuracy of operation of said means to convert voltage into pulses.

3. Apparatus as defined in claim 2, wherein said frequency divider means has a third output tap at a stage corresponding to a lesser divisor than either of said other output taps, in combination with signal means triggered each time said frequency divider receives a number of pulses equal to the divisor at said third output tap.

4. Apparatus as defined in claim 1, wherein the said calculator display comprises a lower and decimal portion and in which the number of output pulses so issued by the frequency divider in the utilization of one kilowatt hour is one hundred such pulses, whereby on inserting the cost per kilowatt hour in the lower decimal portion, and on starting the apparatus, on each one hundred output pulses the higher decimal portion will be incremented by the cost of one kilowatt hour.

5. Apparatus for determining the energy costs of operating an electrical appliance whose current demand may vary, comprising
   a. means to continuously measure the varying current flow to such appliance and to transform into a correspondingly varying voltage,
   b. means to convert such voltage into pulses whose frequency varies substantially directly with the voltage,
   c. frequency divider means having an input connected to receive said pulses and having an output tap at a selected binary stage remote from its input, which output tap issues one output command each time a number of pulses has been received corresponding to the divisor at said stage,
   d. calculator mean so connected to said output tap as to receive said output pulses, the calculator means including means to insert an adding constant and a display incremented by the amount of said adding constant as an adding integer constant each time an output pulse is so issued, and
   e. means to so adjust the foregoing means (a) and (b) that a number of output pulses of the frequency divider means equal to a selected whole number power of ten will be so issued on the utilization by the appliance of one kilowatt hour of current,
whereby on inserting as such adding constant, in digit positions at the right of the display and on receiving such number of output pulses, the cost per kilowatt hour will have incremented the display at a number of digit positions mathematically to the left of those in which such cost was entered, which number of positions equals the power of ten so selected.

6. The method of using electronic components of the pocket calculator type to determine the energy cost of operating an electrical appliance, comprising the steps of dividing the display of a pocket-type calculator into a first portion having a plurality of decimal positions and a second portion having a plurality of next higher decimal positions, entering the rate per kilowatt hour as an adding constant in the two highest decimal positions of said first display portion, and then continuously measuring the current flow to such appliance over the period of time that its operating cost is to be determined, transforming such continuous measurements of such current flow into a varying voltage and further transforming such varying voltage into pulses of proportionately varying frequency, feeding the said pulses as input pulses into a binary frequency divider having an output, whereby to accumulate the input pulses until they reach a number corresponding to the binary divisor at such output and, on each such accumulation, to generate an output pulse command, so determining the stage of the frequency divider at which to take such output pulses and the design values utilized in so measuring current, in transforming to voltage and in transforming to frequency, that one hundred divider output pulses are generated for each kilowatt hour whose flow is so measured, and supplying the output pulses of the frequency divider as chain addition commands to said calculator means, whereby on each output pulse, the calculator means preforms a chain addition with said adding constant and on each hundred output pulses the second portion of the display will be incremented by the cost of one kilowatt hour utilized by such appliance.

7. The method of using electronic components of the pocket calculator type to determine the energy cost of operating an electrical appliance, comprising the steps of entering, in the digit positions at the mathematical right end of the display of such calculator, the cost per kilowatt hour as an adding integer constant and then continuously measuring the current flow to such appliance over the period of time that its operating cost is to be determined, transforming such continuous measurements of current flow into a varying voltage and further transforming such varying voltage into pulses of proportionately varying frequency, feeding the said pulses as input pulses into a binary frequency divider having an output, whereby to accumulate the input pulses until they reach a number corresponding to the binary divisor at such output and, on each such accumulation, to issue an output pulse, so determining the stage of the frequency divider at which to take such output pulses and the design values utilized in so measuring current, in transforming to voltage and in transforming to frequency, that a selected whole number power of ten output pulses are issued for each kilowatt hour whose flow is so measured, and supplying the output pulses of the frequency divider as chain addition commands to said calculator means, whereby on each output pulse so issued, the calculator means performs a chain addition with said adding constant, and on each such number of output pulses, the cost per kilowatt hour will have incremented the display at a number of digit positions mathematically to the left of those in which the rate was so entered, which number of positions equals the power of ten so selected.

* * * * *

UNITED STATES PATENT AND TRADEMARK OFFICE
CERTIFICATE OF CORRECTION

PATENT NO. : 4,814,996
DATED : March 21, 1989
INVENTOR(S) : Douglas W. Wang It is certified that error appears in the above-identified patent and that said Letters Patent is hereby corrected as shown below:

In the title of the invention, delete "CALCULATION" and insert "CALCULATOR".

Column 2, line 6, after "capacity" delete the period.

Column 7, line 25, insert --higher-- before "decimal".

Column 8, line 20, delete "command".

Signed and Sealed this

Twenty-ninth Day of August, 1989

Attest:

DONALD J. QUIGG

Attesting Officer

Commissioner of Patents and Trademarks